United States Patent
Hershberger et al.

(10) Patent No.: US 7,393,701 B2
(45) Date of Patent: Jul. 1, 2008

(54) METHOD OF ADJUSTING BURIED RESISTOR RESISTANCE

(75) Inventors: Douglas B. Hershberger, Essex Junction, VT (US); Alain Loiseau, Williston, VT (US); Kirk D. Peterson, Jericho, VT (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/566,887

(22) Filed: Dec. 5, 2006

(65) Prior Publication Data
US 2008/0131980 A1 Jun. 5, 2008

(51) Int. Cl.
*H01L 21/302* (2006.01)
*H01L 21/308* (2006.01)
(52) U.S. Cl. .......................................... 438/13; 438/385
(58) Field of Classification Search ................... 438/13, 438/382, 385
See application file for complete search history.

(56) References Cited
U.S. PATENT DOCUMENTS

| | | | | |
|---|---|---|---|---|
| 3,996,551 A * | 12/1976 | Croson | ........................ | 338/309 |
| 4,451,328 A * | 5/1984 | Dubois | ........................ | 438/385 |
| 4,643,777 A * | 2/1987 | Maeda | ........................ | 438/385 |
| 5,126,279 A * | 6/1992 | Roberts | ........................ | 438/210 |
| 5,185,285 A * | 2/1993 | Hasaka | ........................ | 438/385 |
| 5,236,857 A * | 8/1993 | Eklund et al. | ........................ | 438/385 |
| 5,466,484 A * | 11/1995 | Spraggins et al. | ........................ | 438/385 |
| 5,656,524 A * | 8/1997 | Eklund et al. | ........................ | 438/238 |
| 5,683,928 A * | 11/1997 | Wojnarowski et al. | ........................ | 427/8 |
| 5,888,875 A * | 3/1999 | Lasky | ........................ | 438/383 |
| 5,963,780 A * | 10/1999 | Ling et al. | ........................ | 438/14 |
| 6,249,029 B1 | 6/2001 | Bryant et al. | | |
| 6,647,614 B1 * | 11/2003 | Ballantine et al. | ........................ | 29/610.1 |
| 7,064,413 B2 | 6/2006 | Fried et al. | | |
| 7,332,402 B2 * | 2/2008 | Freeman | ........................ | 438/382 |
| 2002/0063288 A1 | 5/2002 | Maciejewski et al. | | |
| 2005/0110096 A1 | 5/2005 | Ballantine et al. | | |
| 2005/0167786 A1 | 8/2005 | Gill et al. | | |

* cited by examiner

*Primary Examiner*—M. Wilczewski
(74) *Attorney, Agent, or Firm*—William D. Sabo; Hoffman Warnick LLC

(57) ABSTRACT

Methods of adjusting a resistance of a buried resistor in a semiconductor are disclosed. In one aspect, the method includes using a silicidation blocking mask to define the buried resistor in the semiconductor; adjusting a size of the silicidation blocking mask to adjust a resistance of the buried resistor based on test data from a previous processing lot including a substantially similar buried resistor; and forming silicide on an area not covered by the silicidation blocking mask. The adjustment may be made by balancing the amount of the resistor that is covered with silicide versus un-silicided semiconductor to achieve the desired total resistance. The adjustment may be made according to an algorithm.

5 Claims, 1 Drawing Sheet

US 7,393,701 B2

METHOD OF ADJUSTING BURIED RESISTOR RESISTANCE

BACKGROUND OF THE INVENTION

1. Technical Field

The invention relates generally to integrated circuit (IC) chip fabrication, and more particularly, to a method of adjusting buried resistor resistance.

2. Background Art

In the integrated circuit (IC) chip fabrication industry, circuits often times require buried resistors. One type of buried resistor is an OP resistor, which is formed by implanting in polyconductor or active regions of an IC chip. OP resistors are inexpensive to generate because they use implants and process parameters already required for other devices. Since control of the generation of the other devices is critical for overall operation of the circuit, the control of the OP resistor may suffer. In particular, as manufacturing processing proceeds, adjustments are often times made between wafers and/or lots to control the properties of, for example, field effect transistors (FETs). During these adjustments, OP resistance is typically a secondary concern. As a result, as adjustments are made to control the structure as the prime devices dictate, OP resistance tends to drift. Consequently, matching of the resistance to design values is problematic. One approach to address this situation is having a dedicated implant for the OP resistor. However, this approach imposes increased expense and complexity.

SUMMARY OF THE INVENTION

Methods of adjusting a resistance of a buried resistor in a semiconductor are disclosed. In one aspect, the method includes using a silicidation blocking mask to define the buried resistor in the semiconductor; adjusting a size of the silicidation blocking mask to adjust a resistance of the buried resistor based on test data from a previous processing lot including a substantially similar buried resistor; and forming silicide on an area not covered by the silicidation blocking mask. The adjustment may be made by balancing the amount of the resistor that is covered with silicide versus un-silicided semiconductor to achieve the desired total resistance. The adjustment may be made according to an algorithm.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1A:
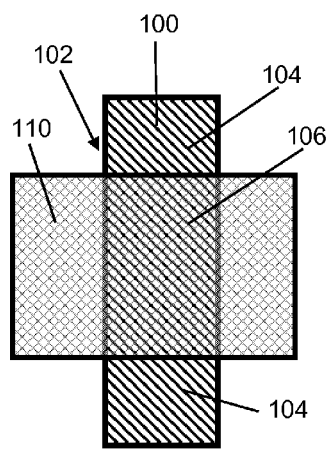
FIGS. 1A-C show one embodiment of a method of forming a buried resistor.
Figure 1B:
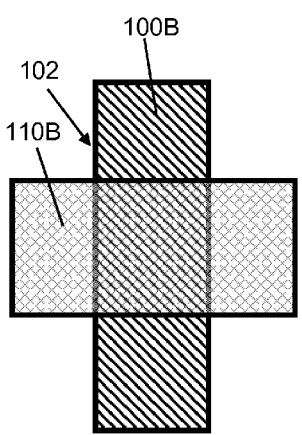
Figure 1C:
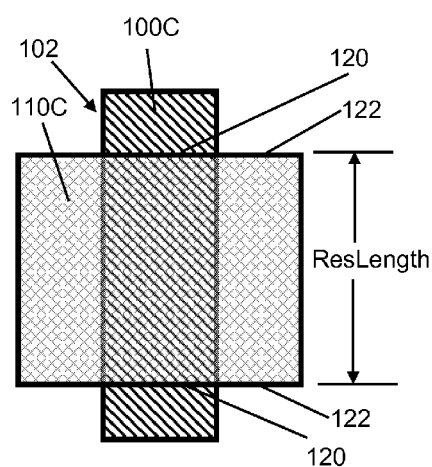

Referring to FIGS. 1A-1C, one embodiment of a method of adjusting the resistance of a buried resistor 100 is illustrated. In one embodiment, buried resistor 100 is an OP resistor formed in a semiconductor 102 (including 104 and 106, collectively). However, the teachings of the invention are applicable to other types of buried resistors. Semiconductor 102 may be either a polyconductor such as polysilicon or an active region of monocrystalline silicon.

In FIG. 1A, a silicidation blocking mask 110 is used to define buried resistor 100 in semiconductor 102. Silicidation blocking mask 110 may include, for example, one or more of silicon nitride, silicon dioxide and silicon oxy-nitride. Silicidation blocking mask 110 may be formed at any number of stages, for example, during formation of spacers (not shown) for FETs. At this stage, according to one embodiment, semiconductor 102 already has any implanting present necessary to generate its core film resistance value. Buried resistor 100, as illustrated, includes an area(s) 104 to be silicided (hereinafter "silicided area 104") and an area 106 to be un-silicided (hereinafter "un-silicided area 106"). OP resistor resistance values can be expressed as two resistors in series: the resistance of silicided area 104 and un-silicided area 106, the latter of which is formed under silicidation blocking mask 110.

As described above, shifts in processes for a processing lot as required to generate prime devices such as FETs (not shown) can vary the resistance of buried resistor 100 between processing lots. It is understood that shifts in processes can be caused by a variety of factors, e.g., different equipment, location, operating parameters, etc. In order to accommodate this situation and adjust the resistance of buried resistor 100, a size of silicidation blocking mask 110 can be adjusted to adjust the resistance of buried resistor 100 based on test data (e.g., resistance values) of a previous processing lot including a substantially similar buried resistor. In particular, adjustment of the resistance can be made by shifting the mean resistance of un-silicided area 106 by adjusting the size of un-silicided area 106 via adjustment of the size of silicidation blocking mask 110. The adjustment may be made by balancing the amount (area) of the resistor that is covered with silicide area 104 versus un-silicided area 106 to achieve the desired total resistance. This adjustment can be made by making a new mask according to the algorithm described later. The sheet resistance per unit size of silicided area 104 is low compared to un-silicided area 106, so by changing the amount of area that is silicided, the total resistance can be adjusted to meet the value required for the circuit to function.

To further illustrate, FIG. 1B shows a silicidation blocking mask 110B that has been reduced in size compared to that of a substantially similar buried resistor 100 (FIG. 1A), e.g., from a previous processing lot. A buried resistor 100B resulting from silicidation of the structure in FIG. 1B would have decreased length, and thus decreased resistance compared to buried resistor 100 in FIG. 1A. Similarly, a buried resistor 100C resulting from silicidation of the structure in FIG. 1C would have increased length, and thus increased resistance compared to buried resistor 100 in FIG. 1A.

In one embodiment, silicidation blocking mask 110 size adjustment can be made according to an algorithm. For example, where semiconductor 102 includes at least one of poly-cyrstalline, single crystal or amorphous silicon, silicon germanium (SiGe), gallium arsenide (GaAs) and gallium nitride (GaN), the adjusting may include adjusting the size according to the following:

$$ResLength\alpha = (\text{resistor edge intersect polyconductor})$$
$$\text{space (same NET)} \times [1+((Rs-Rs\alpha)/Rs)]$$

NET=connect semiconductor to (resistor edges intersect semiconductor), where ResLengthα equals a resistor length correction required to correct for a shift in the substantially similar buried resistor, Rs equals a sheet resistance that is required for the circuit to operate, and Rsα equals a sheet resistance for a current processing. (Note, the resistance of silicided area 104 is typically negligible, and therefore removed from the equation.) Further, NET is the connection of semiconductor and resistor edges intersecting the polyconductor, and 'edge' is the border of the resistor. Therefore, '(resistor edge intersect semiconductor) space (same NET)' is a space of borders of the resistor which are connected through shapes through the semiconductor level, and 'resistor edges intersecting semiconductor' is an intersecting of the resistor and the semiconductor level. The ResLength dimension and resistor edges 120 intersecting semiconductor are shown in FIG. 1C only.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of adjusting a resistance of a buried resistor in a semiconductor, the method comprising:

using a silicidation blocking mask to define the buried resistor in the semiconductor;

adjusting a size of the silicidation blocking mask to adjust a resistance of the buried resistor based on test data from a previous processing lot including a substantially similar buried resistor; and forming silicide on an area not covered by the silicidation blocking mask.

2. The method of claim 1, wherein the semiconductor includes monocrystalline silicon or polysilicon.

3. The method of claim 1, wherein, in the case that the semiconductor includes at least one of poly-cyrstalline, single crystal or amorphous silicon, silicon germanium (SiGe), gallium arsenide (GaAs) and gallium nitride (GaN), the adjusting includes adjusting the size according to the following:

$$ResLength\alpha = (\text{resistor edge intersect semiconductor})$$
$$\text{space (same NET)} \times [1+((Rs-Rs\alpha)/Rs)]$$

NET=connect semiconductor to (resistor edges intersect semiconductor), where ResLengthα equals a resistor length correction required to correct for a shift in the substantially similar buried resistor, Rs equals a sheet resistance of the semiconductor required for the circuit to operate, Rsα equals a sheet resistance for a current processing, '(resistor edge intersect polyconductor) space (same NET)' is a space of borders of the resistor which are connected through shapes on a polyconductor level, and 'resistor edges intersect polyconductor' is an intersection of the resistor and the polyconductor level.

4. The method of claim 1, wherein the silicidation blocking mask includes at least one of silicon nitride, silicon dioxide and silicon oxy-nitride.

5. The method of claim 1, wherein the semiconductor includes dopants.

* * * * *